United States Patent
Kang et al.

(10) Patent No.: US 8,558,455 B2
(45) Date of Patent: Oct. 15, 2013

(54) ORGANIC ELECTROLUMINESCENT DISPLAY

(75) Inventors: Tae-Min Kang, Yongin (KR); Myung-Won Song, Yongin (KR); Seong-Taek Lee, Yongin (KR); Jin-Woo Park, Yongin (KR); Hun Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 475 days.

(21) Appl. No.: 12/382,240

(22) Filed: Mar. 11, 2009

(65) Prior Publication Data

US 2009/0179565 A1 Jul. 16, 2009

Related U.S. Application Data

(62) Division of application No. 10/803,143, filed on Mar. 18, 2004, now Pat. No. 7,247,986, and a division of application No. 11/512,090, filed on Aug. 30, 2006, now Pat. No. 7,387,557, and a division of application No. 11/512,091, filed on Aug. 30, 2006, now Pat. No. 7,521,857, and a division of application No. 12/382,241, filed on Mar. 11, 2009, now Pat. No. 7,915,811.

(30) Foreign Application Priority Data

Jun. 10, 2003 (KR) .................. 10-2003-0037244
Jun. 23, 2003 (KR) .................. 10-2003-0040808
Sep. 2, 2003 (KR) .................. 10-2003-0061163

(51) Int. Cl.
*H05B 33/00* (2006.01)
*H01J 1/62* (2006.01)

(52) U.S. Cl.
USPC .................. 313/512; 313/506; 313/498

(58) Field of Classification Search
USPC .................. 313/498–512; 445/23–25; 257/10
See application file for complete search history.

(56) References Cited

U.S. PATENT DOCUMENTS 4,590,128 A * 5/1986 Kawai .................. 428/411.1
5,800,625 A 9/1998 Engelsberg
(Continued)

FOREIGN PATENT DOCUMENTS

CN 1309429 8/2001
CN 1414643 4/2003
(Continued)

OTHER PUBLICATIONS

Korean Office action from KIPO issued on Mar. 31, 2005, corresponding to Korean Patent Application No. 10-2003-0040808 (with English Translation).

(Continued)

*Primary Examiner* — Joseph L Williams
(74) *Attorney, Agent, or Firm* — Robert E. Bushnell, Esq.

(57) ABSTRACT

An organic electro luminescent display with auxiliary layers on a cathode contact and an encapsulating junction region to easily remove polymer organic layers of the junction. The organic electro luminescent display has the first electrode formed on a lower insulating substrate, a pixel defining layer formed to make some portions of the first electrode opened over the entire surface of the lower insulating substrate, an organic emission layer formed on an opening of the first electrode, the second electrode formed on the organic emission layer, an upper substrate for encapsulating the first electrode, the organic emission layer and the second electrode, and auxiliary layers formed on the cathode contact and the encapsulating junction region of the lower insulating substrate.

20 Claims, 15 Drawing Sheets

(56) References Cited

U.S. PATENT DOCUMENTS

| | | | |
|---|---|---|---|
| 5,814,156 A | 9/1998 | Elliott | |
| 5,882,487 A | 3/1999 | Li | |
| 5,958,268 A | 9/1999 | Engelsberg | |
| 5,994,835 A | 11/1999 | Wilson et al. | |
| 6,033,484 A | 3/2000 | Mahoney | |
| 6,133,693 A | 10/2000 | Keyser | |
| 6,489,590 B2 | 12/2002 | Livshits et al. | |
| 6,624,572 B1 * | 9/2003 | Kim et al. | 313/512 |
| 6,639,359 B1 | 10/2003 | Chae | |
| 6,641,933 B1 | 11/2003 | Yamazaki et al. | |
| 6,744,077 B2 * | 6/2004 | Trottier et al. | 257/103 |
| 6,833,668 B1 * | 12/2004 | Yamada et al. | 313/505 |
| 6,894,431 B2 | 5/2005 | Yamazaki et al. | |
| 6,894,821 B2 | 5/2005 | Kotchick | |
| 6,936,846 B2 | 8/2005 | Koyama et al. | |
| 6,946,789 B2 | 9/2005 | Ikeda | |
| 7,012,367 B2 | 3/2006 | Seki | |
| 7,067,985 B2 | 6/2006 | Adachi | |
| 7,075,233 B2 * | 7/2006 | Ng et al. | 313/512 |
| 7,247,986 B2 | 7/2007 | Kang et al. | |
| 7,309,880 B2 | 12/2007 | Terashita | |
| 7,521,857 B2 * | 4/2009 | Kang et al. | 313/504 |
| 2003/0062829 A1 | 4/2003 | Heimgartner | |
| 2003/0066311 A1 * | 4/2003 | Li et al. | 65/43 |
| 2003/0194484 A1 | 10/2003 | Yamazaki et al. | |
| 2004/0070335 A1 | 4/2004 | Cok | |

FOREIGN PATENT DOCUMENTS

| | | |
|---|---|---|
| JP | 11-212104 | 8/1999 |
| JP | 2000-352717 | 12/2000 |
| KR | 10-2000-0036020 | 6/2000 |
| KR | 10-2001-0044613 | 6/2001 |
| KR | 10-2002-0064028 | 8/2002 |
| KR | 10-2002-008371 | 11/2002 |
| KR | 10-2002-0083578 | 11/2002 |
| KR | 10-2003-0027305 | 4/2003 |
| KR | 2003-0027305 | 4/2003 |
| WO | WO 99/03122 | 1/1999 |
| WO | WO 2004021461 A2 * | 3/2004 |

OTHER PUBLICATIONS

Office Action from the Chinese Patent Office issued in Applicant's corresponding Chinese Patent Application No. 200410035079.8 dated Jan. 4, 2008.

Zhigilei et al., "*Microscopic Mechanism of Laser Ablation of Organic Solids in the Thermal and Stress Confinement Irradiation Regimes,*" Journal of Applied Physics, vol. 88, Aug. 1, 2000, pp. 1281-1297.

Certificate of patent from the Chinese Patent Office issued in Applicant's corresponding Chinese Patent Application No. 200410035079.8 dated Dec. 31, 2008.

Office action from Chinese Patent Office issued in Applicant's corresponding Chinese Patent Appiication No. 200810098547.4 dated Jun. 5, 2009.

Notice of Allowance (Paper No. 20101112) issued on Nov. 30, 2010 in the U.S. Appl. No. 12/382,241.

* cited by examiner

Laser Removal of Organic Emission Layer 150
absent Auxiliary Layers 120/130

Laser Removal of Organic Emission Layer 150
on Auxiliary Layers 120/130

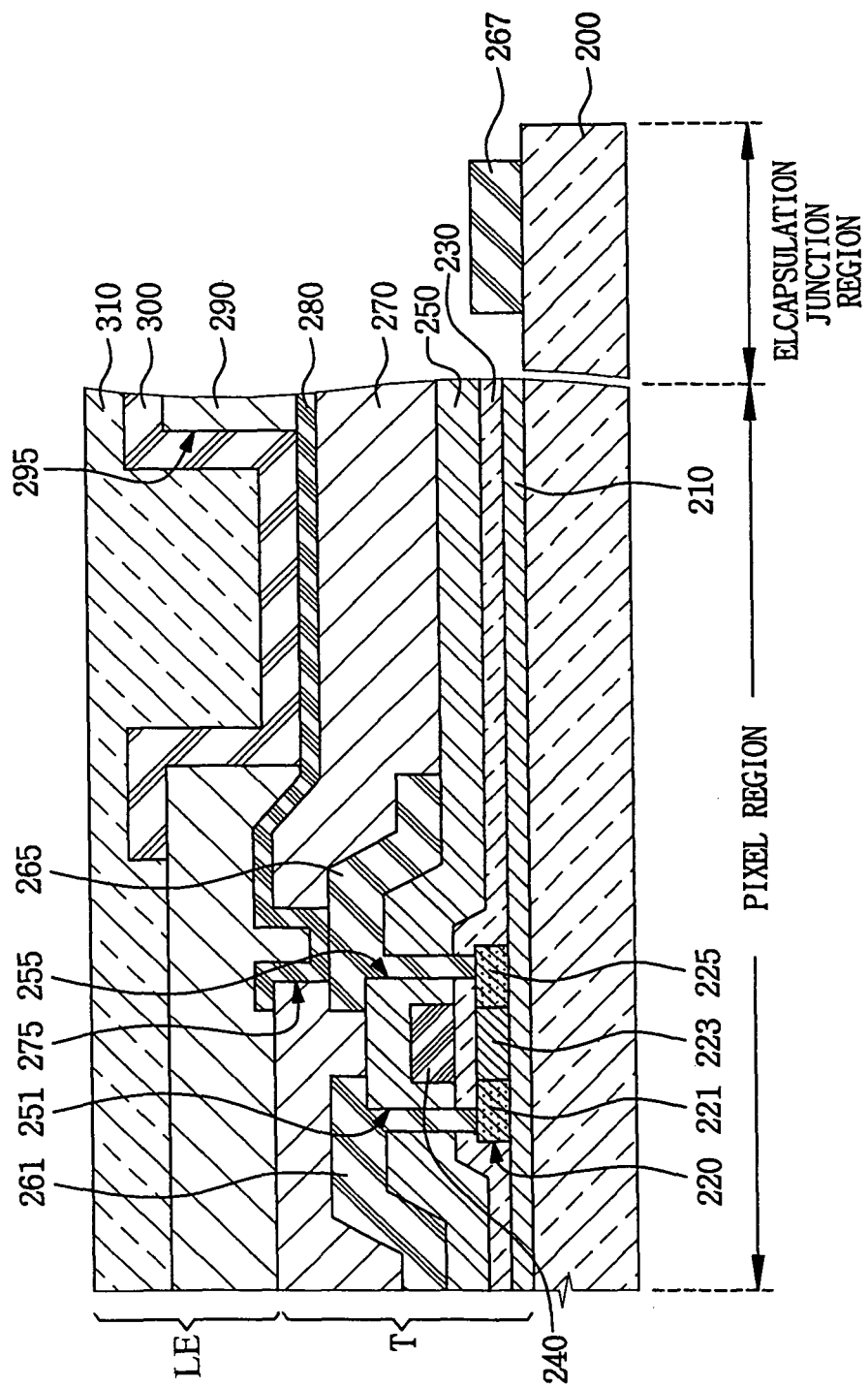

ORGANIC ELECTROLUMINESCENT DISPLAY

CLAIM OF PRIORITY

This application claims priority under 35 U.S.C. §119, §120 and §121 variously to an application entitled "ORGANIC ELECTRO LUMINESCENCE DISPLAY AND METHOD FOR FABRICATING THE SAME", filed in the Korean Intellectual Property Office on 10 Jun. 2003 and assigned Serial No. 2003-37244, to an application entitled "ORGANIC ELECTRO LUMINESCENCE DISPLAY AND METHOD FOR FABRICATING THE SAME", filed in the Korean Intellectual Property Office on 23 Jun. 2003 and assigned Serial No. 2003-40808, and to an application entitled "ORGANIC ELECTRO LUMINESCENCE DISPLAY AND METHOD FOR FABRICATING THE SAME", filed in the Korean Intellectual Property Office on 2 Sep. 2003 and assigned Serial No. 2003-61163, as a divisional of an application entitled "ORGANIC ELECTRO LUMINESCENCE DISPLAY AND METHOD FOR FABRICATING THE SAME", filed in the U.S. Patent & Trademark Office on 18 Mar. 2004, assigned Ser. No. 10,803,143 and subsequently issued on 24 Jul. 2007 as U.S. Pat. No. 7,247,986, as a divisional of an application entitled "ORGANIC ELECTRO LUMINESCENCE DISPLAY AND METHOD FOR FABRICATING THE SAME", filed in the U.S. Patent & Trademark Office on 30 Aug. 2006, assigned Ser. No. 11/512,090, and subsequently issued on 17 Jun. 2008 as U.S. Pat. No. 7,387,557, as a divisional of an application entitled "ORGANIC ELECTRO LUMINESCENCE DISPLAY AND METHOD FOR FABRICATING THE SAME", filed in the U.S. Patent & Trademark Office on 30 Aug. 2006, assigned Ser. No. 11/512,091, and subsequently issued on 21 Apr. 2009 as U.S. Pat. No. 7,521,857, and as a divisional of an application entitled "ORGANIC ELECTRO LUMINESCENCE DISPLAY AND METHOD FOR FABRICATING THE SAME", filed in the U.S. Patent & Trademark Office on 11 Mar. 2009, assigned Ser. No. 12/382,241, and subsequently issued on 29 Mar. 2011 as U.S. Pat. No. 7,915,811 the contents of which are hereby incorporated in their entireties by reference.

BACKGROUND OF THE INVENTION

1. Field of the Invention

The invention relates to an organic electro luminescent display and a method for fabricating the same and, more particularly, to an organic electro luminescent display having an auxiliary layer encapsulating junction region and a method for fabricating the same.

2. Description of the Related Art

Generally, an organic electro luminescent display is an emissive display capable of emitting light by electrically exciting a fluorescent or phosphorescent organic compound, and phosphorescent organic compound can be driven by a low voltage and has a thin form-factor, a wide viewing angle and a fast response speed, so that the electro luminescent display can solve problems that have been found in liquid crystal displays. Therefore, the electro luminescent display has attracted attention as a next-generation display.

Such an organic electro luminescent display has a structure that has an organic light emitting diode (OLED) including an organic layer having at least emission layer(EML), an anode, and a cathode, wherein the organic layer having a predetermined pattern is formed on a glass or other transparent insulating substrate, and the anode and cathode electrodes are formed on upper and lower portions of the organic layer for applying a driving voltage to the organic layer. The organic layer consists of organic compounds.

In the organic electro luminescent display having the above-mentioned basic structure, as an anode electrode and a cathode electrode voltages are applied to the electrodes, holes injected from the electrode that have been applied with the anode electrode voltage are transported to the emission layer (EML) through a hole transporting layer (HTL), and electrons are injected from the electrode that have been applied with the cathode electrode voltage are transported to the emission layer (EML) through an electron transporting layer (ETL). The electrons and holes are then recombined in the emission layer(EML) to create excitons, and the exitons are then changed from an exciting state to a ground state, thereby emitting an organic substance of the emission layer (EML) and embodying a required image.

In the above-mentioned organic electro luminescent display, when a polymer material is used for the organic layer, the organic layer is generally formed on a substrate by spin coating. However, when the organic layer is formed by the spin coating, the organic layer is also formed in regions other than the pixel portion. Thus, the organic layer of the encapsulating junction region needs to be removed to encapsulate an inner structure of the organic electro luminescent display.

In a prior art, a cleaning process using an organic solvent was performed to remove the organic layer of the encapsulating junction region, however, the process has a significantly low accuracy and the organic solvent often penetrates into the pixel portion, so that there is a high possibility of damaging the pixel portion.

To solve the above-mentioned problems, a method using a laser is disclosed to remove a foreign substance including organic emissive materials off a substrate. According to a Korean laid-open Patent Application No. 2000-0036020, a method for removing the foreign substance using the laser is disclosed. This method removes organic or inorganic foreign substances on the substrate by directly irradiating the ultraviolet laser on the surface of the substrate.

In the case of the substrate of the prior art, a metal wiring and a passivation layer are usually deposited on a glass substrate in the encapsulating junction region. However, the laser energy absorption rate of the passivation layer is small so that the organic layer is not easily removed by using a laser.

SUMMARY OF THE INVENTION

It is therefore an object of the present invention to provide for an improved design for an electro luminescent display.

It is also an object of the present invention to provide for a novel method for making an electro luminescent display.

It is further an object of the present invention to provide for a novel structure of an electro luminescent display that allows for easier selective removal of an organic emissive layer using a laser.

It is yet another object of the present invention to provide a novel method of making an electro luminescent display that more efficiently selectively removes unwanted materials using a laser without destroying other portions of the electro luminescent display.

It is further an object of the present invention to provide a novel structure for an electro luminescent display that allows for sealant to be efficiently cured by ultraviolet light while preventing other parts of the electro luminescent display from being harmed by the curing ultraviolet light.

It is further an object of the present invention to provide a novel method for making an electro luminescent display that allows for sealant between the substrates and between the electrodes to be efficiently sealed by ultraviolet light where other portions of the display are not harmed by exposure to the curing ultraviolet light.

These and other objects can be achieved by an organic electro luminescent display, which has the first electrode formed on a lower insulating substrate, a pixel defining layer formed to make some portions of the anode electrode opened over the entire surface of the lower insulating substrate, an organic layer formed on an opening of the anode electrode, the second electrode formed on the organic layer, an upper substrate for encapsulating the anode electrode, the organic layer and the cathode electrode, and auxiliary layers formed on a cathode contact and an encapsulating junction region of the lower insulating substrate. The organic layer is deposited over the first electrode and the auxiliary layers. The organic layer is selectively removed by laser from the auxiliary layers. The material for the auxiliary layers are carefully chosen so that the organic layers can be removed from the auxiliary layers with relatively little amount of laser light.

The present invention also includes a method for making the electro luminescent display having the auxiliary layers and the application of laser light to remove the organic layers off the auxiliary layers via laser ablation.

The invention separately provides a novel structure for an organic electro luminescent display. The novel display is made up of upper and lower substrates bounded to each other by an ultraviolet light curable sealant. The sealant is placed around the pixel region in an encapsulation region. A reflecting plate is placed adjacent to the sealant. The reflecting plate is used to reflect the ultraviolet light so that less light is needed to cure the sealant. Less light or more efficient use of the ultraviolet light means that the other parts of the electro luminescent display are not degraded or damaged due to exposure to an excessive amount of ultra violet light. The sealant and the reflecting plate can be used in either active or passive matrix pixel structures. In place of the reflecting plate, a waveguide can be used adjacent to the sealant.

The present invention also pertains to a method of making the above structure for an electro luminescent display including the application of the reflective plate and/or waveguide and the ultraviolet curing step.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 7 is a view illustrating both a pixel region for an active matrix pixel and an encapsulating junction region according to the fourth embodiment of the invention;

DETAILED DESCRIPTION OF THE INVENTION

Figure 1:
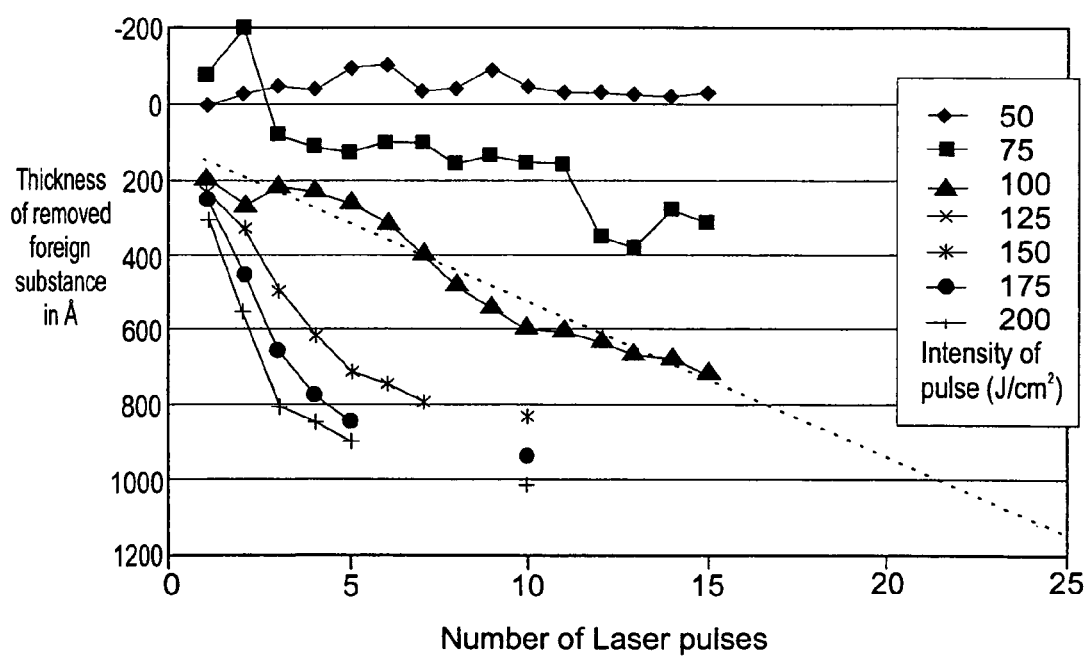
FIG. 1 is a graph illustrating empirically a relationship between application of laser energy versus removal of an organic layer absent the use of auxiliary layers under the organic layer.

Turning now to FIG. 1, FIG. 1 illustrates empirical results for thickness of removed foreign substance based on number of laser pulses applied and the energy of each pulse. As illustrated in FIG. 1, as the number of laser pulses increases, the amount or thickness of removed foreign substances does not increase in a linear fashion with the number of laser pulses applied. For example, as the thickness of the remaining organic layers becomes thinner, the removal rate per additional laser pulse decreases, so that a significant amount of energy and a large number of laser pulses are required to completely remove the residual substances. Because a large number of laser pulses at a high energy per pulse is needed to completely remove the foreign substance, the laser may cause damage to the substrate in the foreign substance removal process.

In addition to the removal of foreign substances by a laser, in the organic electro luminescent display of the prior art, a sealant is used to join the substrates together. An upper substrate is bound to a lower insulating substrate via this sealant. The sealant also serves to encapsulate organic electro luminescent elements and plays a role in determining a lifetime, efficiency, etc. of the organic electro luminescent elements.

The organic electro luminescent element mainly is divided into an inner pixel portion that actually emits light and a pad portion for connecting an external driving IC for driving the pixel portion, wherein the driving portion and the pad portion are connected by a wiring made of opaque metals to minimize resistance. In this case, an encapsulating process using a sealant is performed to prevent moisture and air from an outside of a display from coming into contact with and destroying the organic electro luminescent element. The sealant is ordinarily cured by exposure to light, especially ultraviolet light. However, when the lower insulating substrate is attached to and encapsulated by the upper substrate using the ultraviolet cured sealant, it takes more time to cure the sealant using the ultraviolet light. Because an immense amount of ultraviolet light is needed to cure the sealant, the ultraviolet light can damage other portions of the display, either by heating parts up or causing an unwanted chemical reaction in the display. If the amount of ultraviolet light used to cure the sealant is reduced to prevent the damage to other parts of the display, the sealant will not be fully cured because the sealant has not received adequate exposure to the ultraviolet light to fully cure.

Figure 2:
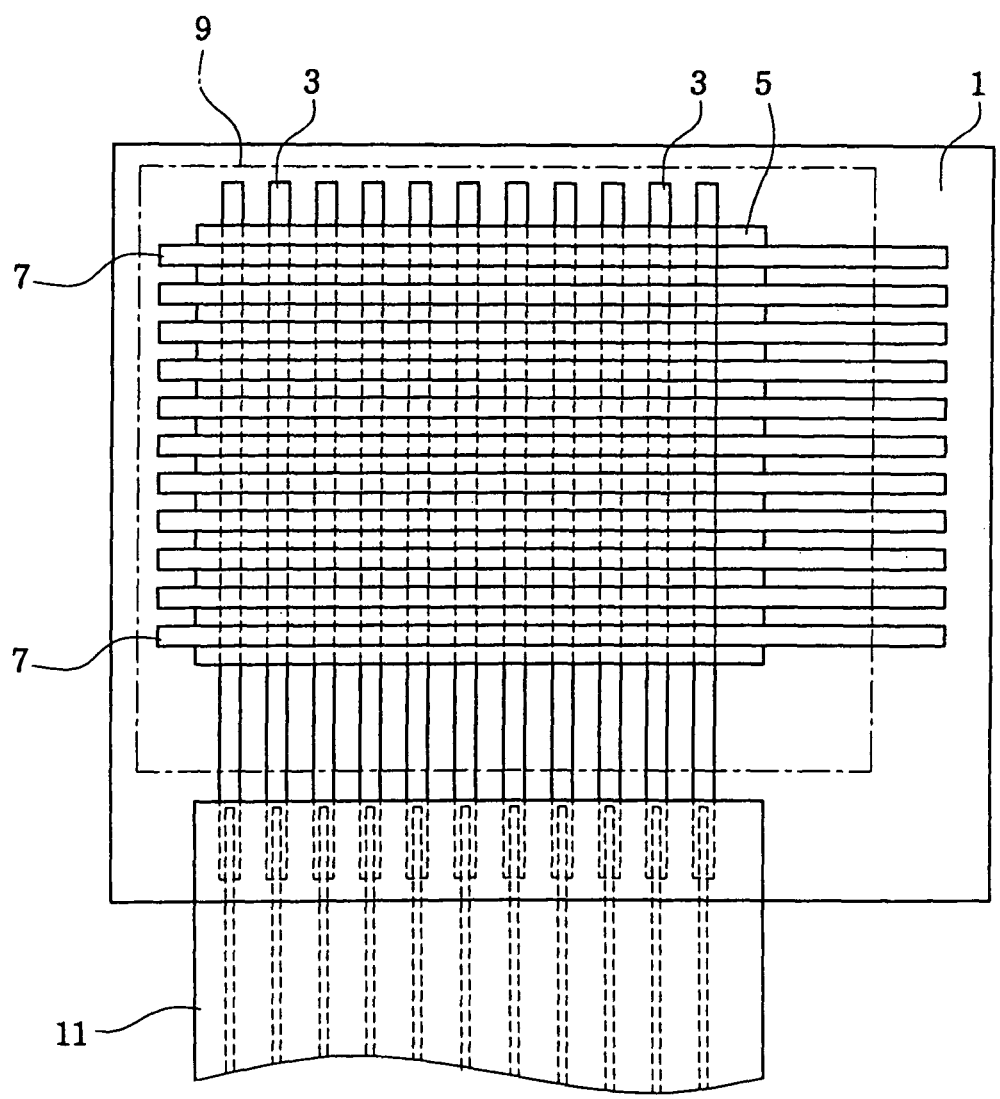
FIG. 2 is a plane view for explaining an organic electro luminescent display.
Figure 5:
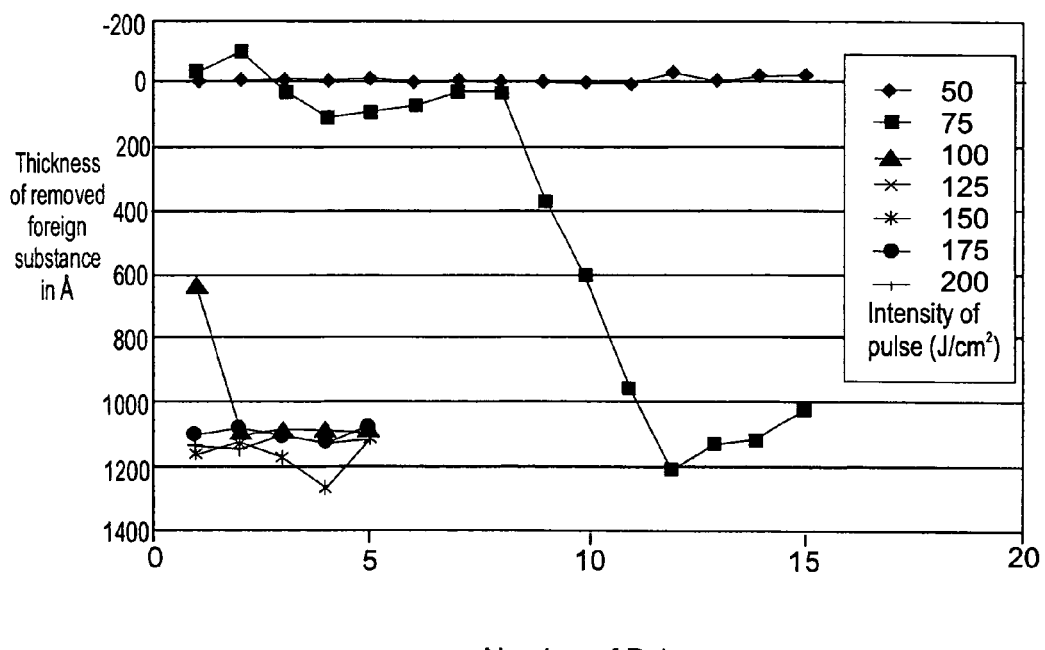
FIG. 5 is a graph illustrating empirically a relationship between application of laser energy versus removal of an organic layer when the organic layer is formed over the auxiliary layers according to the present invention.

Turning now to FIG. 2, FIG. 2 illustrates an organic electro luminescent display of the prior art (FIG. 5 of Korean laid-open Patent Application No. 2000-0036020). The process used to form the display of FIG. 2 will now be described. A plurality of first electrodes 3 made of optically transmissive materials are formed in an arbitrary pattern, such as a stripe pattern, over one surface of a lower insulating substrate 1. Lower insulating substrate 1 is made out of a material that is both electrically insulating and optically transmissive. An insulating layer 5 is formed on the first electrodes 3, and a plurality of second electrodes 7 are formed on insulating layer 5 in a stripe pattern to a direction orthogonal to the first electrodes 3.

In this case, pixel portions of the organic electro luminescent display are where the first electrodes 3 and the second electrodes 7 are cross each other. Where second electrodes 7 and first electrodes 3 cross each other, the insulating layer 5 in these crossed regions is not present. Instead, a thin organic layers disposed in these cross over regions. The organic emissive material (not illustrated in FIG. 2) is also in electrical contact with both the first electrodes 3 and the second electrodes 7 in the cross over areas.

In this case, an upper substrate 9 (illustrated as a dotted line in FIG. 2) is disposed over a lower substrate 1, and the lower substrate 1 and the upper substrate 9 are bound to each other by a sealant that is not illustrated in FIG. 2, so that the organic electro luminescent display of FIG. 2 is formed.

According to the above-mentioned structure of FIG. 2, some portions of the first electrodes 3 and the second electrodes 7 are exposed outside the substrates 1 and 9 so that electrodes 3 and 7 can be electrically connected to circuit driving elements, for example FPC (Flexible Printed Circuit, 11). Circuit 11 is electrically connects external equipment to the organic electro luminescent display by thermal compression, etc.

However, in the organic electro luminescent display having the above-mentioned structure, the process of applying and curing the sealant is not properly performed when the lower substrate 1 and the upper substrate 9 are sealed together, thereby decreasing the lifetime and reliability of the product. In the typical prior art, a sealing material is applied along the periphery of the lower substrate 1 as described above and the upper substrate 9 is mounted thereon, and ultraviolet rays are irradiated from the rear surface of the lower substrate 1 and the sealing material is cured, so that the lower substrate 1 and the upper substrate 9 are bonded together.

When the ultraviolet rays irradiate the sealing material disposed in a portion of the display that is exposed outside the first and second electrodes 3 and 7 on the substrates 1 and 9 (i.e., the lower and right sides of FIG. 2), the sealing material was cured without any significant problems because the ultraviolet light was not blocked or hindered by the electrode layers 3 and 7. However, when the ultraviolet rays irradiate the sealing material disposed in a portion of the display where the striped patterns of electrode layers 3 and 7 are present (i.e., the upper and the left sides in FIG. 2) the presence of the electrode layers 3 and 7 hinders the ultraviolet rays from effectively reaching the sealant between the substrates 1 and 9 thus requiring more pulses and/or higher energy pulses to fully cure the sealant in these regions of the display. If the sealant is not properly cured by an adequate exposure to ultraviolet light, air and moisture will then be allowed to penetrate through the sealant and into the emissive layers to cause deterioration of a display.

The present invention has 10 embodiments. The first three embodiments concentrate on the auxiliary layers in both structure and in method of making. Organic layers on top of the auxiliary layers are more easily removed via exposure to a laser than if the auxiliary layers were not present.

FIRST EMBODIMENT

Figure 3:
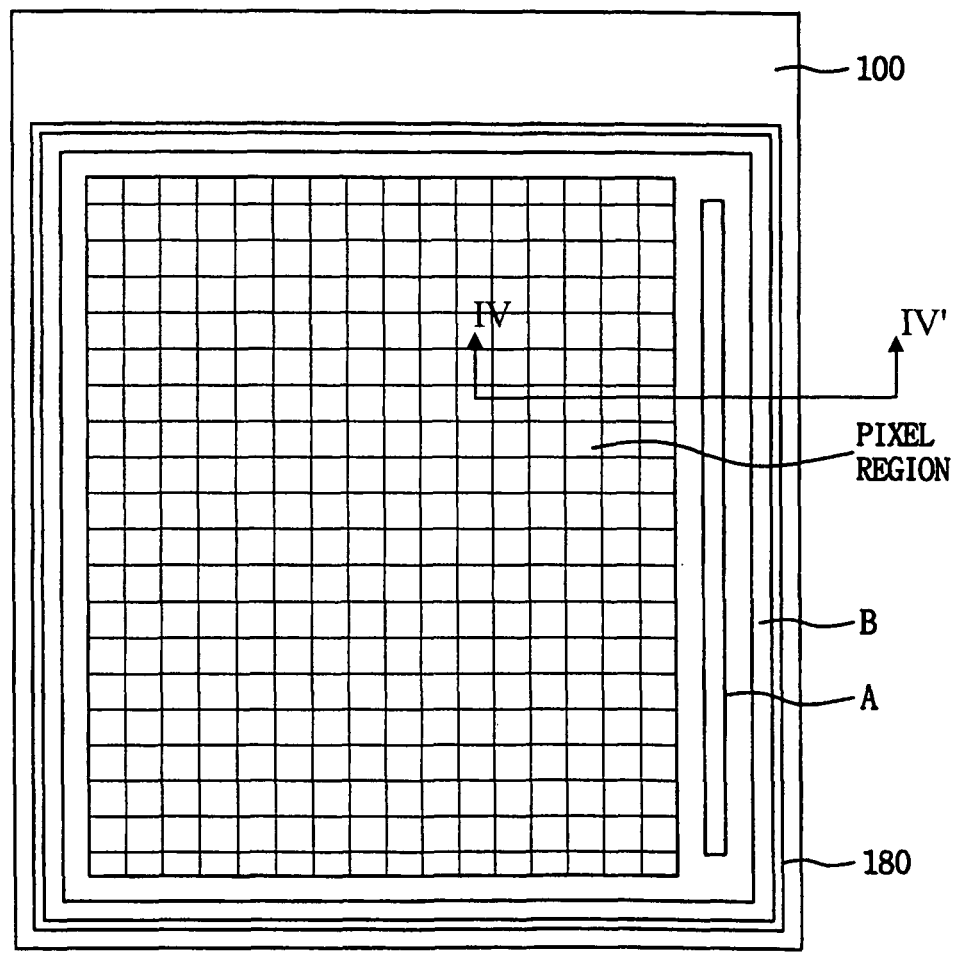
FIG. 3 is a plane view showing an organic electro luminescent display according to the first three embodiments of the present invention.

Turning now to FIG. 3, FIG. 3 is a plane view illustrating an organic electro luminescent display according to a first embodiment of the present invention, and FIGS. 4A to 4D are cross-sectional views illustrating a process for making the organic electro luminescent display of FIG. 3 according to an embodiment of the present invention.

Figure 4A:
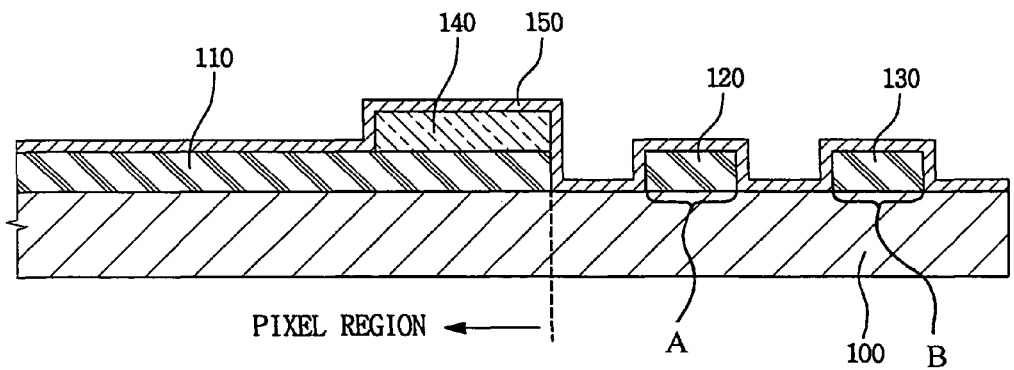
FIGS. 4A to 4D are cross-sectional views illustrating the process of making the display of FIG. 3 according to a first embodiment of the present invention.

Referring to FIG. 4A, a first electrode (or anode electrode) 110 is deposited on substrate (or lower substrate) 100. First electrode is made out of a transparent and conductive material such as ITO (indium tin oxide), IZO (indium zinc oxide) or ICO (indium cesium oxide). This transparent first electrode material is deposited and patterned on the lower insulating substrate 100, and a transparent anode electrode, in other words, the first electrode 110 formed in the pixel portion. Lower substrate 100 may be a transparent substrate made out of an electrically insulating material, such as glass.

In the first embodiment, the auxiliary layers 120 and 130 are made out of the same material as the first electrode 110. Therefore, the auxiliary layers 120 and 130 are deposited and patterned on lower substrate 100 at the same time as when the first electrode 110 is deposited and patterned on lower substrate 100. Auxiliary layer 120 is formed at cathode contact A while auxiliary layer 130 is formed at encapsulating junction region B.

After forming the auxiliary layer 130 on the encapsulating junction region B, the auxiliary layer 120 on the cathode contact A, and the anode 110 of the pixel portion, a pixel defining layer 140 is deposited and patterned on first electrode 110 covering parts of first electrode 110 and leaving other parts of the top surface of first electrode exposed. The pixel defining layer 140 is preferably an inorganic material and a polymer such as an acrylic photoresist or a polyimide.

Next, the organic layer 150 is deposited to cover the pixel defining layer 140, the exposed portions of the first electrode 110, the auxiliary layers 120 and 130, and over exposed portions of lower substrate 100. The organic layer 150 is preferably formed by spin coating. The organic emission layer 150 preferably includes at least an emission layer(EML) and has a multi-layered structure made up of at least one of a hole injection layer (HIL), a hole transporting layer (HTL), an emission layer(EML), an electron transporting layer (ETL), and an electron injection layer (EIL).

Figure 4B:
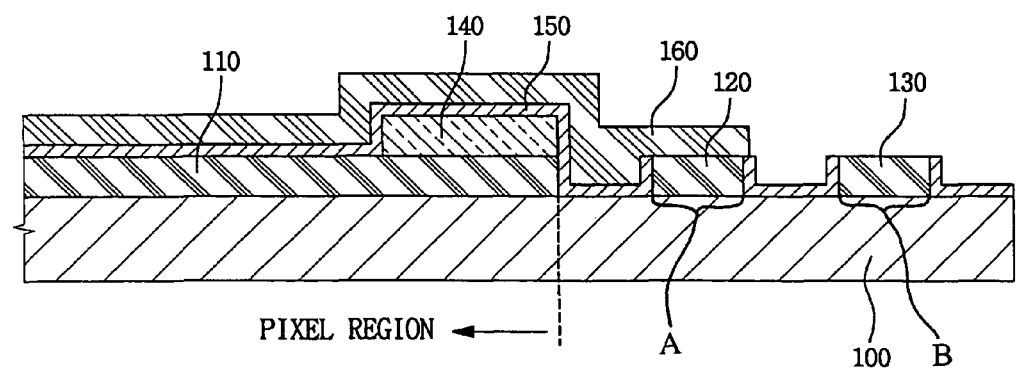

Referring now to FIG. 4B, after forming the organic layer 150, the organic layers on the auxiliary layers 120 and 130 over cathode contact A and the encapsulating junction region B of the substrate are removed. The process of selectively removing the organic layers 150 from the auxiliary layers 120 and 130 is preferably accomplished by exposing these portions of organic layers 150 with light pulses from a laser. This process of removing the organic layers 150 using a laser is called laser ablation. In addition, a type of the laser can be selected from an UV based one (Eximer laser, Nd: YAG laser, etc) to an IR based one (Nd: YAG, $CO_2$ laser, etc) according to a material of a light source.

After removing the organic layers from the tops of the auxiliary layers 120 and 130, a conductive material is then deposited and patterned on the structure to form the second electrode or cathode electrode 160. The cathode electrode 160 performs a role of transporting electrons to the electron transporting layer of organic layer 150 by using a metal electrode such as Al, Mg, Ag, Ca that has a low work function.

Figure 4C:
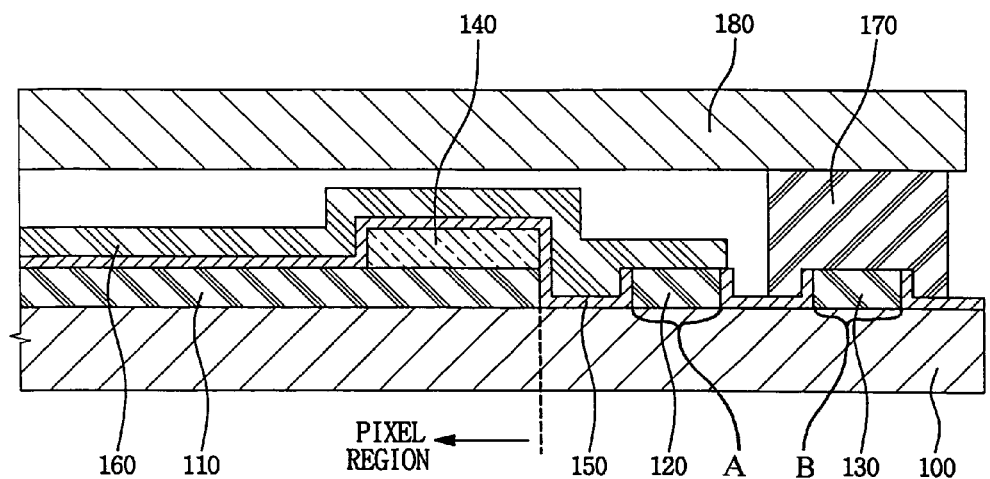
Figure 4D:
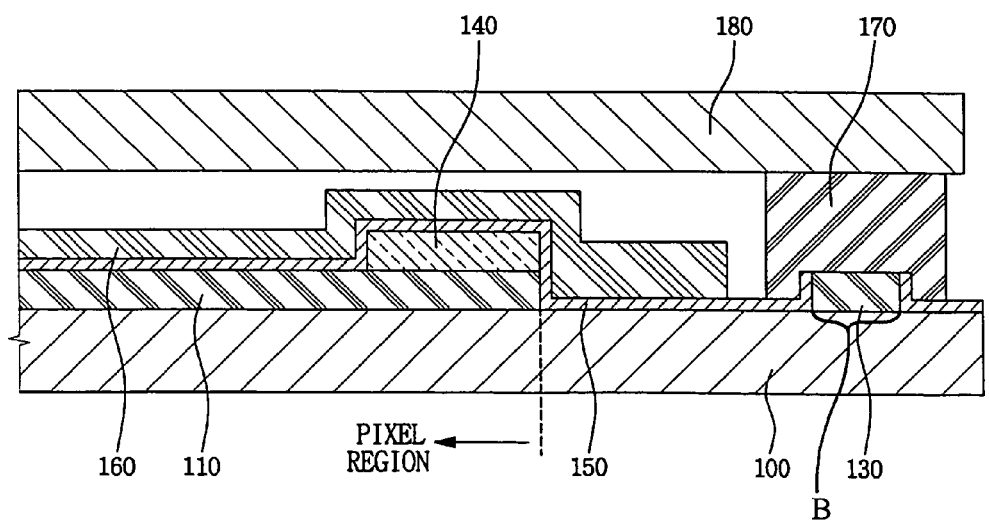

Referring now to FIGS. 4C and 4D, after forming the cathode electrode 160, an upper substrate 180 is attached to the top of the electro luminescent display using an encapsulating adhesive 170. The encapsulating adhesive is formed over auxiliary layer 130 which is over encapsulating junction region B of lower substrate 100. Therefore, encapsulating adhesive 170 is formed around the periphery of the electro luminescent display and surrounds the pixel region.

Referring to FIG. 5, FIG. 5 is a graph illustrating empirically the amount of an organic layer 150 that is removed by a laser based on the number of laser pulses and the energy intensity of each pulse. FIG. 5 is for the scenario of where the organic layers 150 is supported by auxiliary layers 120 and 130. FIG. 5 is to be compared with FIG. 1 which illustrates removal thicknesses of the organic layers when the organic layers 150 are not on top of an auxiliary layer. In the method for removing foreign substances on the substrate 100 where the foreign substances are organic layers on top of an auxiliary layer 120/130, by using the auxiliary layers 120 and 130, the organic layers are more easily removed since less pulses and less intensity is needed to remove the organic layers when they are supported by auxiliary layers 120 and 130. It is to be appreciated that other materials can also be removed by the laser in addition to the organic layers. Therefore, in this specification, foreign substances includes the organic layers but is not limited thereto. Less number of pulses and less intensity of pulses means that the remainder of the electro luminescent display sustains less damage from the laser pulses when auxiliary layers 120 and 130 are used (FIG. 5) compared to when they are not used (FIG. 1).

FIG. 5 illustrates that 12 pulses with an energy intensity of 75 $J/cm^2$ can remove the entire organic layer if the organic layer is supported by auxiliary layers 120 and 130. This compares with 25 pulses of 100 J/cm2 for when the organic layers are not supported by the auxiliary layers. Because having the auxiliary layers 120 and 130 present allows for the removal of the organic layers with less pulses with less intensity, the other parts of the electro luminescent display sustain less damage when auxiliary layers 120 and 130 are incorporated into the design.

More preferably, a removing depth of the organic layer can be maximized by irradiating the laser with energy density not less than 125 $mJ/cm^2$. That is, when the organic layers are removed by using the auxiliary layer and the laser, energy required for removing the organic layers is small.

SECOND EMBODIMENT

The organic electro luminescent display according to a second embodiment has a similar structure as that of the first embodiment except the material used for the auxiliary layers 120 and 130 is different. In the second embodiment, the material used in the auxiliary layers 120 and 130 is the same as the material used in pixel defining layer 140. Therefore, pixel defining layer 140 and the auxiliary layers 120 and 130 can be formed at the same time. The pixel defining layer and the auxiliary layers are deposited at the same time and the patterning and etching of the pixel defining layer 140 and auxiliary layers 120 and 130 are accomplished in a single step. As discussed previously, the pixel defining layer 140 is preferably an inorganic material and a polymer such as an acrylic photoresist or a polyimide. By having the auxiliary layers 120 and 130 made out of the same material as the pixel defining layer 140, the number of pulses needed and the energy intensity of each pulse to remove the organic layer is reduced from the case of FIG. 1 where no auxiliary layers were present.

THIRD EMBODIMENT

The organic electro luminescent display according to a third embodiment has a similar structure as that of the first embodiment except that the auxiliary layers 120 and 130 for removing the organic layers 150 are formed by using materials having a laser energy absorption rate higher than that of the organic layer 150 for the laser wavelength used to remove the organic layer.

That is, after forming the pixel defining layer 140 in the first embodiment, the auxiliary layers 120 and 130 are formed on the cathode contact A and the encapsulating junction region B by depositing and patterning materials having a higher laser energy absorption rate for the laser wavelength used in the removal process The third embodiment is not necessarily mutually exclusive from the first or the second embodiment. For example, use of ITO, IZO or ICO could result in the auxiliary layer having a higher absorption of the laser light than the organic layer and thus the auxiliary layers 120 and 130 can still be made at the same time as the first electrode 10. Also, use of acrylic photoresist or polyimide for auxiliary layers 120 and 130 may have a higher absorption than organic emission layer 150 and thus the auxiliary layers 120 and 130 can be made at the same time that the pixel defining layer 140 is made.

Now embodiments 4 through 10 will now be discussed. In these embodiments, the focus is on an ultraviolet cured sealant used to fix a top substrate to the bottom substrate. A reflecting plate and/or a wave guide is placed adjacent to the sealant so that the sealant can be cured with less ultraviolet light than if no reflecting plate or waveguide is used. Consequently, by using less ultraviolet light to cure, the remaining parts of the electro luminescent display are subjected to less ultraviolet radiation and thus less damage results.

FOURTH EMBODIMENT

Figure 6A:
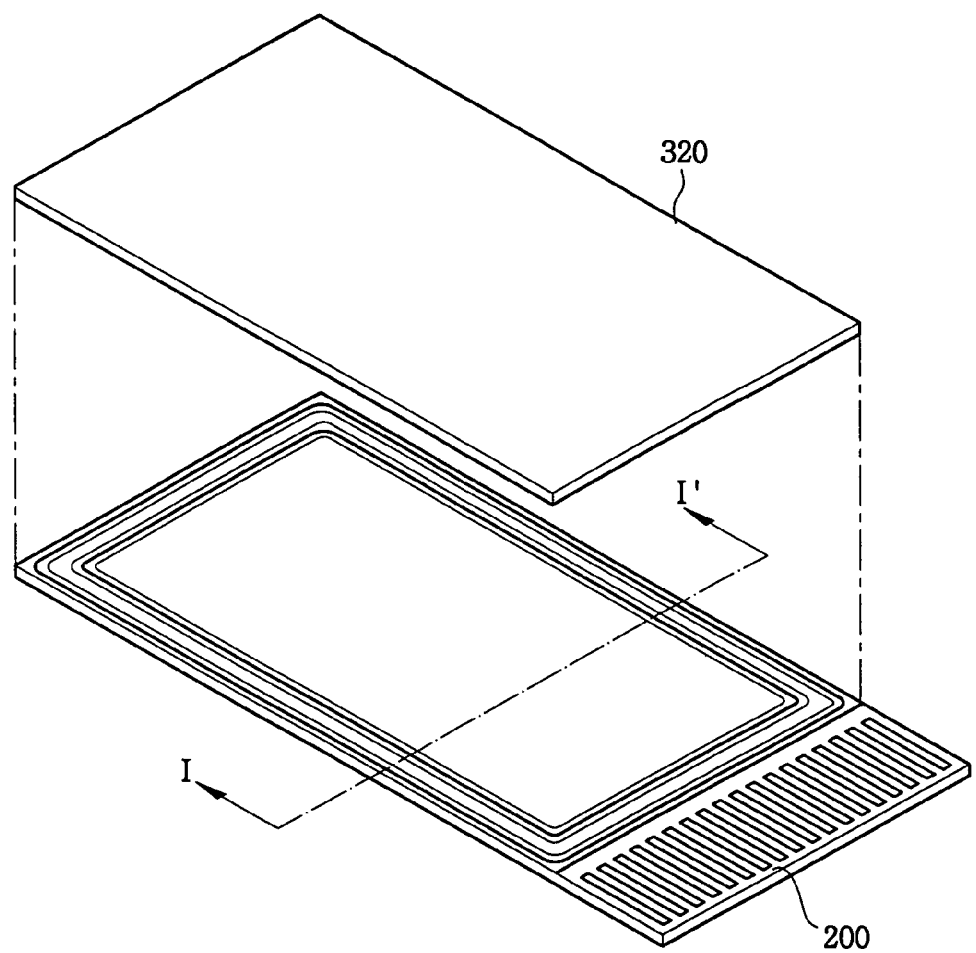
FIG. 6A is an exploded perspective view showing an organic electro luminescent display according to a fourth embodiment of the invention.
Figure 6B:
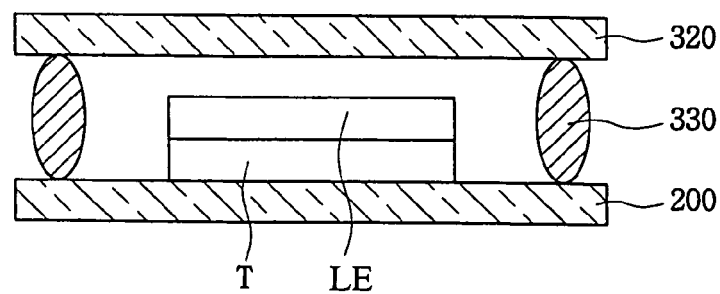
FIG. 6B is a cross-sectional view of the display of FIG. 6A taken along the I-I'.

Turning now to FIGS. 6A and 6B, FIG. 6A is an exploded perspective view illustrating an organic electro luminescent display according to a fourth embodiment of the invention, and FIG. 6B is a cross-sectional view taken along the I-I' direction of FIG. 6A. Referring to FIGS. 6A and 6B, the organic electro luminescent display of the fourth embodiment of the present invention has a structure that a lower insulating substrate 200 having a pixel portion is bonded to an upper substrate 320 at an encapsulating junction region, the plurality of pixels being located in the pixel portion. That is, in the organic electro luminescent display of the present invention, the pixel portion is formed on the upper side of the transparent lower insulating substrate 200, and can be formed in a typical structure of the organic electro luminescent display. The fourth embodiment can be either a passive matrix or an active matrix using thin film transistors or TFTs.

For example, when the organic electro luminescent display L is formed in a passive matrix (PM) type, the pixel portion is made up of electrode layers corresponding anode and cathode electrodes, respectively, and organic layers having emission layer disposed on positions corresponding to the common portions where the anode and cathode layers cross each other. When the organic electro luminescent display is formed in a active matrix (AM) type, the pixel portion can further include thin film transistors TFTs. The fourth embodiment of the present invention can be applied to any structure with the pixel portion, however, for example, an active matrix organic electro luminescent display will now be described in conjunction with FIG. 7.

Figure 8:
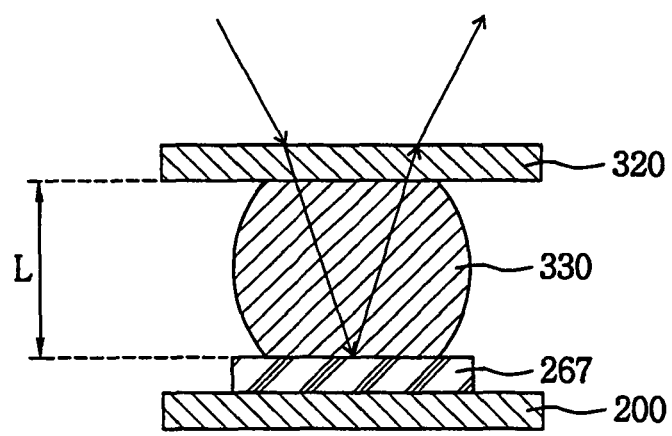
FIG. 8 is a cross sectional view of the encapsulation junction region according to the fourth embodiment of the present invention where a reflection plate is on an inside side of the lower insulating substrate.

Turning now to FIG. 7, FIG. 7 illustrates a cross-sectional view illustrating an active matrix type pixel and an encapsulating junction region according to the fourth embodiment of the present invention. FIG. 8 is a cross-sectional view illustrating an encapsulating junction region of the organic electro luminescent display according to the fourth embodiment of the invention. The organic electro luminescent display according to the fourth embodiment of the present invention has a structure that includes a reflecting plate 267 adjacent to sealant 330. Reflecting plate 267 and sealant 330 are disposed in the encapsulation portion region of the electro luminescent display. Sealant 330 permanently binds the upper substrate 320 to the lower substrate 200.

Referring to FIGS. 7 and 8, a method for fabricating the organic electro luminescent display having the reflecting plate 267 in the encapsulating junction region will now be described. Referring to FIG. 7, a buffer layer 210 is formed on the lower insulating substrate 200 to prevent impurities such as metal ions diffused from the lower insulating substrate 200 from penetrating to an active layer. After forming the buffer layer 210, amorphous silicon is deposited and crystallized on the buffer layer 210 to form a polycrystalline silicon layer, which is then patterned to form the active layer 220. A gate insulating layer 230 is deposited on all surfaces of the lower insulating substrate 200 containing the active layer, and gate metal is deposited and patterned on the gate insulating layer to form a gate electrode 240.

After forming the gate electrode 240, an impurity having a predetermined conductive type is doped in the active layer by using the gate electrode 240 as a mask to form source/drain regions 221. and 225. A region with no impurity doped between the source region 221 and the drain region 225 acts as a channel region 223. After forming the source/drain regions 221 and 225 on the active layer 220, an interlayer insulating layer 250 is formed over the entire surface of the lower insulating substrate 200, and contact holes 251 and 255 are formed to expose some portions of the source/drain regions 221 and 225 on the interlayer insulating layer 250.

After depositing a conductive material on the interlayer insulating layer 250 including the contact holes 251 and 255, the conductive material is patterned to form source/drain electrodes 261 and 265 connected to the source/drain regions 221 and 225 through the contact holes, thereby forming a TFT (T) consisted of the active layer 220, a gate electrode 240, and the source/drain electrodes 261 and 265, etc.

In this case, when the source/drain electrodes 261 and 265 are formed, a reflecting plate 267 of a metal thin layer consisted of the conductive material is also formed in the encapsulating junction region of the lower insulating substrate 200 at the same time. A metal having a good reflectivity is used for the conductive material, and generally Al, Cr, Mo, W, Ti, Ta, or alloy thereof is used for the same. After forming the reflecting plate 267 of the encapsulating junction region and the source/drain electrodes 261 and 265, a passivation layer 270 is deposited on the lower insulating substrate 200, and a via-hole 275 is formed on the passivation layer 270 to expose some portions of one of the source electrode 261 and the drain electrode 265, for example, some portions of the drain electrode 265.

After depositing a lower electrode material on the passivation layer 270 including the via-hole 275, the lower electrode is patterned to form a lower electrode 280 electrically connected to the drain electrode 265 through the via-hole 275. After forming the lower electrode 280, a pixel defining layer 290 is deposited on the entire surface of the lower insulating substrate 200 and patterned to form an opening portion 295 that exposes some portions of the lower electrode 280.

An organic layer 300 is then formed on the pixel defined layer 290 including the opening portion 295. And an upper electrode 310 is formed on the organic layer 300 over the entire surface of the lower insulating substrate 200 to form a light emitting element (LE) made up of the lower electrode 280, organic layer 300, and the upper electrode 310. The lower insulating substrate 200 is then encapsulated to the upper substrate 320 by using a sealant 330 in the encapsulating junction region.

The sealant 330 is preferably a light-curing sealant, and more preferably a light curing sealant capable of being cured not only by exposure to light in an ultraviolet range but also to light in the visible range. 30Y-296G (three bond), XNR5516 (Nagase Ciba), electrolyte, or Kyoritsu are preferably used for the sealant 330.

In addition, the thickness "L" in FIG. 8 of the sealant 330 is a distance between the reflecting plate 267 and the upper substrate 320. This thickness L is preferably set to cause constructive interference in the light used to cure the sealant 330. Constructive interference is to occur between the incident light and the light reflected off the reflecting plate 267. The optimal distance L between the reflecting plate and the opposite substrate can be determined by the following equation:

$$L=\lambda/4+(n-1)\lambda/2 (n=1,2,3,\ldots)$$

And ultraviolet rays or visible rays are then irradiated on the upper substrate 320 to cure the sealant 330. The optimal range for wavelength used to cure the sealant is from 200 nm to 700 nm. Another design consideration is that it is preferable to have at least 25% of the total surface area of the sealant 330 in contact with reflecting plate 267. As discussed earlier, it is preferable to form the reflecting plate 267 and the source/drain electrodes 261 and 265 at the same time to reduce the number of processing steps and to reduce manufacturing costs in the fourth embodiment. Alternatively, the reflecting plate 267 can be deposited and patterned at the same time as when the gate electrode 240 is formed. Alternatively, the reflecting plate 267 can be formed at the beginning of the process, before buffer layer 210 is formed on lower insulating substrate 200. Before forming the buffer layer 210, a material having good reflectivity, such as any one metal of Al, Mo, Ti, Ag and Mg, or an alloy containing at least one of these metals (i.e., Mo/Al/Mo, Ti/Al/Ti) may be deposited and patterned on the lower insulating substrate 200 to form the reflecting plate 267 in the encapsulating junction region of the display.

In another design consideration, the width of the reflecting plate 267 in FIG. 8 is illustrated to be larger than the contact area of the sealant 330, however, the width of the reflecting plate 267 may be formed to be smaller than the contact area contact area of the sealant 330. In such a scenario, the sealant 330 may contact lower insulating substrate 200.

The inclusion of the reflecting plate 267 in the design of the electro luminescent display attached to a light-cured sealant 330 in the edge or encapsulation junction region is advantageous for the following reason. Light used to cure the sealant 330 also exposes other portions of the electro luminescent display. This light used to cure the sealant 330 can damage other parts of the electro luminescent display. By placing a reflective plate in the encapsulation junction region of the display, less incident light energy is needed to cure the sealant because both the incident light and the reflected light can be used to cure the sealant. Therefore, the intensity of the incident light needed to cure the sealant is less if the reflecting plate is present. Therefore, because less incident light is needed to cure the sealant, less damage is sustained by the electro luminescent display during the curing process.

Figure 9:
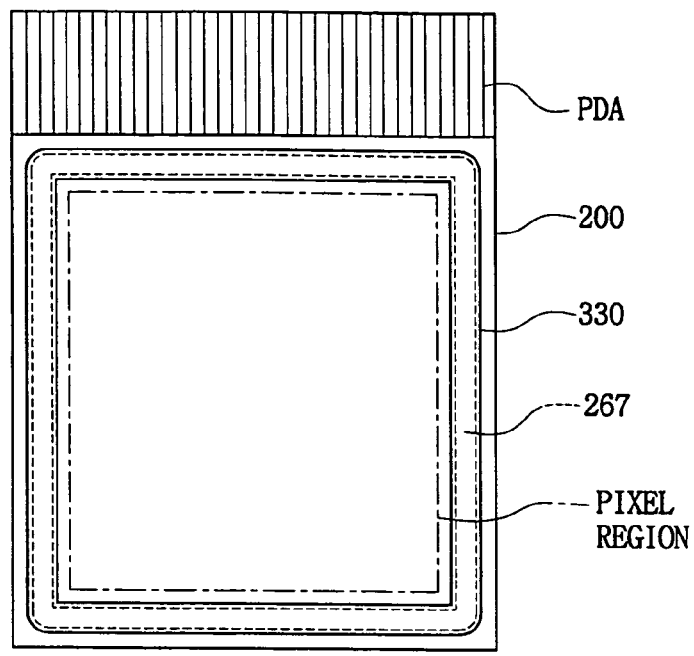
FIGS. 9 and 10 are plane views for explaining an arrangement of a reflection plate vis-a-vis the sealant and the pixel region according to the fourth embodiment of the present invention.
Figure 10:
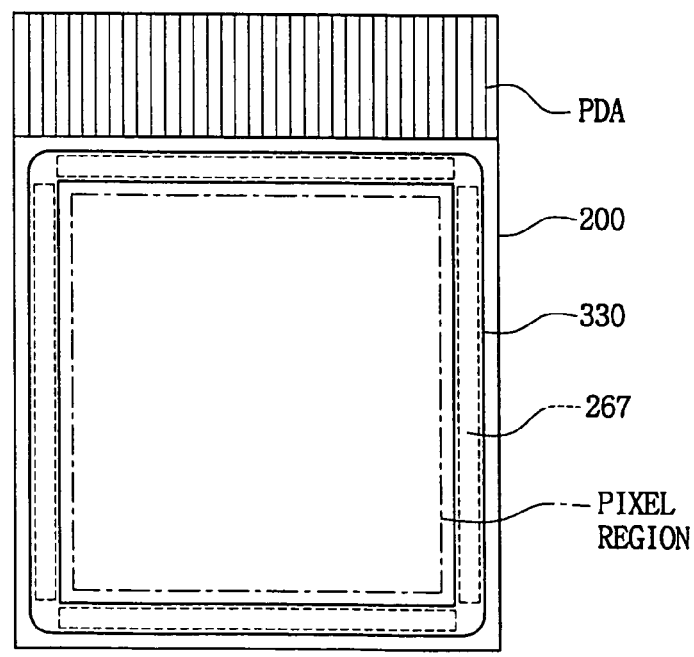

Turning now to FIGS. 9 and 10, FIGS. 9 and 10 illustrate top views of electro luminescent displays according to the fourth embodiment of the present invention. As is clearly illustrated in FIGS. 9 and 10, the width of the sealant 330 is greater than the width of the reflecting plate 267. Therefore, in the designs illustrated in FIGS. 9 and 10, the sealant 330 may be in contact with lower insulating substrate 200.

In FIG. 9, the reflecting plate 267 is formed as one continuous piece in the form of a closed square. Alternatively, in FIG. 10, the reflecting plate 267 is formed of four discrete portions disconnected from each other. It is to be appreciated that the reflecting plate 267 does not serve to conduct electricity, and thus having four discrete segments in FIG. 10 works just as well as one continuous closed piece in FIG. 9.

FIFTH EMBODIMENT

Figure 11:
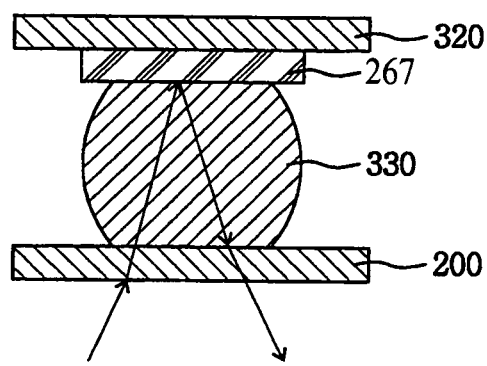
FIG. 11 illustrates a cross section of an encapsulation junction region according to a fifth embodiment of the present invention where the reflection plate is on an inside side of the upper substrate.

FIG. 11 is a cross-sectional view showing the encapsulating junction region of the organic electro luminescent display in accordance with a fifth embodiment of the invention. The organic electro luminescent display according to the fifth embodiment has a similar structure as that of the fourth embodiment except the location of the reflecting plate 267. The reflecting plate 267 in the fifth embodiment of the present invention is in an inside surface of upper substrate 320 instead of being on the inside surface of lower insulating substrate 200. In order to form the structure of FIG. 11, after forming the TFT and the light emitting element LE on the lower insulating substrate 200 as illustrated in FIG. 7, a metal thin layer is then deposited and patterned on the inner side of the upper substrate 320 to form the reflecting plate 267 in the encapsulating junction region. As in the fourth embodiment, the upper substrate 320 is bonded to the lower insulating substrate 200 by using the sealant 330 in the encapsulating junction region.

SIXTH EMBODIMENT

Figure 12:
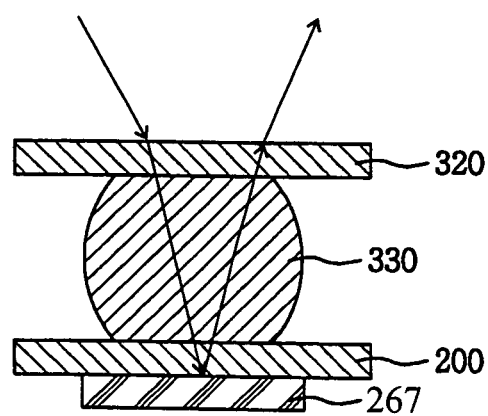
FIG. 12 illustrates a cross section of an encapsulation junction region according to a sixth embodiment of the present invention where the reflection plate is on an outside side of the lower insulating substrate.

FIG. 12 is a cross sectional view showing an encapsulating junction region of the organic electro luminescent display in accordance with a sixth embodiment of the invention. The organic electro luminescent display according to the sixth embodiment has a similar structure as that of the fourth and fifth embodiments except for the location of the reflecting plate 267. In the sixth embodiment, the reflecting plate 267 is located on the outer side of lower insulating plate 200. In the sixth embodiment as in the fourth and the fifth embodiments, the reflecting plate is located only in the encapsulated junction region at the edges of the electro luminescent display.

In order to make the structure of FIG. 12, after forming the TFT and the light emitting element on the lower insulating substrate 200 as illustrated in FIG. 7, the upper substrate 320 is bonded to the lower insulating substrate 200 by using the sealant 330 in the encapsulating junction region. After encapsulating the upper substrate 320 to the lower insulating substrate 200, a metal thin layer is deposited and patterned on an outer side of the lower insulating substrate 200 to form the reflecting plate 267 in the encapsulating junction region.

SEVENTH EMBODIMENT

Figure 13:
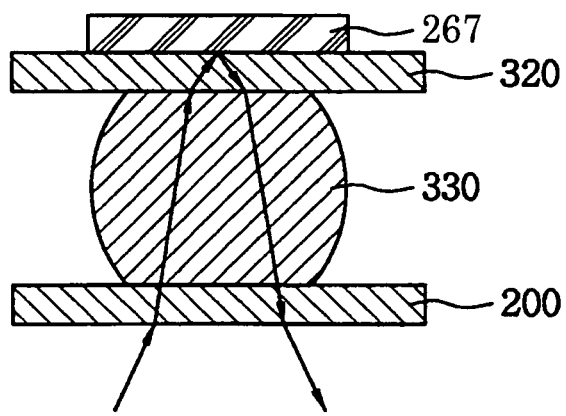
FIG. 13 illustrates a cross section of an encapsulation junction region according to a seventh embodiment of the present invention where the reflection plate is on an outside side of the upper substrate.

FIG. 13 is a cross sectional view showing an encapsulating junction region of the organic electro luminescent display in accordance with a seventh embodiment of the invention. The organic electro luminescent display according to the seventh embodiment has a similar structure as that of the fourth embodiment but that the reflecting plate 267 is formed on an outer side of the upper insulating plate 320 as opposed to an inner side of lower insulating substrate 200.

In order to form the structure of FIG. 13, after forming the TFT and the light emitting element on the lower insulating substrate 200 as illustrated in FIG. 7, a thin metal layer is deposited and patterned on the outer side of the upper substrate 320 to form the reflecting plate 267 in the encapsulating junction region. After forming the reflecting plate 267 in the encapsulating junction region on the outer side of the upper substrate 320, the upper substrate 320 is then bonded to the lower insulating substrate 200 by using the sealant 330 in the encapsulating junction region.

EIGHTH EMBODIMENT

Figure 14A:
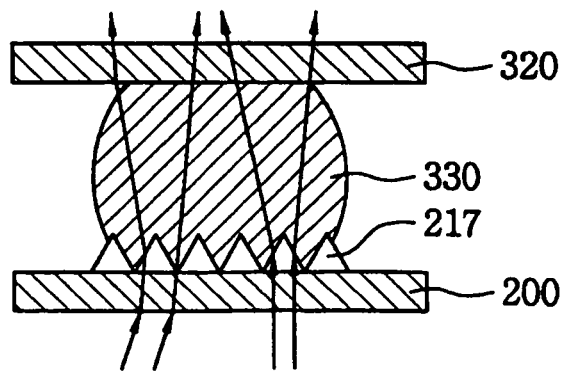
FIGS. 14A and 14B illustrate a cross section of an encapsulation junction region according to an eighth embodiment of the present invention where a wave guide is located on an inside side of the lower insulating substrate.
Figure 14B:
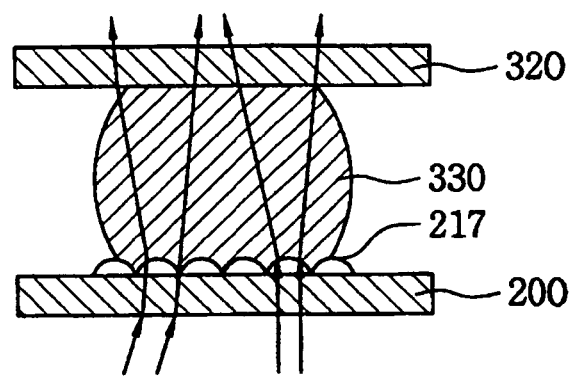

FIG. 14A and FIG. 14B are a cross sectional view showing an encapsulating junction region of the organic electro luminescent display in accordance with an eighth embodiment of the invention. The organic electro luminescent display according to the eighth embodiment has a similar structure as that of the fourth embodiment except that a waveguide 217 is formed on the inner side of lower insulating substrate instead of the reflecting plate 267. Preferably the wave guide is unevenness or a convex lens. FIG. 14A illustrates the wave guide 217 as unevenness. FIG. 14B illustrates wave guide 217 as a convex lens.

Referring to FIG. 14A and FIG. 14B, the wave guide 217 of the organic electro luminescent display according to the eighth embodiment is formed on the inner side of the encapsulating junction region of the lower insulating substrate 200 during the process of forming the TFT having the structure illustrated in FIG. 7 in the pixel portion. After depositing and patterning the buffer layer 210, the wave guide 217 is formed in a position corresponding to the encapsulating junction region of the lower insulating substrate 200.

Alternatively, the wave guide 217 may be formed simultaneous to the patterning the gate insulating layer 230 and after depositing the gate insulating layer 230. Alternatively, wave guide 217 can be formed simultaneous to the etching of the interlayer insulating layer 250 to form the contact holes 251 and 255. Alternatively, the wave guide 217 may be formed simultaneous to the etching of the passivation layer 270 to form the via-hole 275.

Another alternative is to form a multi-layered wave guide 217 that is formed simultaneous to the formation of the buffer layer 210, gate insulating layer 230, interlayer insulating layer 250, and passivation layer 270. Alternatively, wave guide 217 made out of material having the optical transmissivity may be formed in a separate process step separate from the process of forming the other layers in FIG. 7.

The wave guide 217 is formed by adjusting an angle in consideration of a refraction index of the incident light, and makes the incident light focused on the sealant 330 of the encapsulating junction region to be formed later by the refraction.

NINTH EMBODIMENT

Figure 15A:
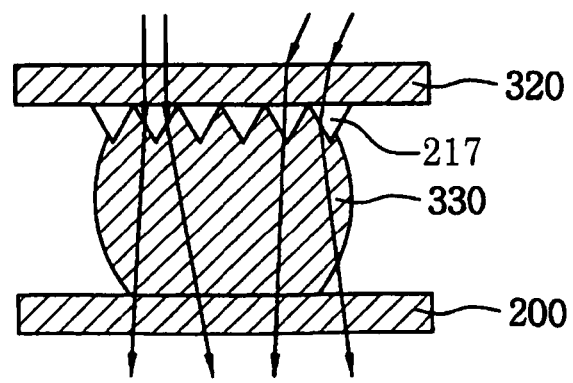
FIGS. 15A and 15B illustrate a cross section of an encapsulation junction region according to a ninth embodiment of the present invention where a wave guide is located on an inside side of the upper substrate.
Figure 15B:
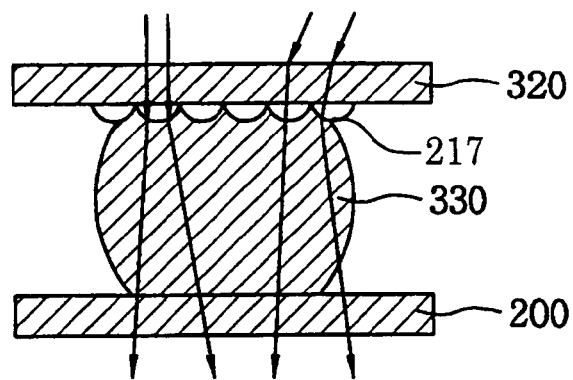

FIG. 15A and FIG. 15B are a cross-sectional view showing an encapsulating junction region of the organic electro luminescent display in accordance with a ninth embodiment of the invention. The organic electro luminescent display according to the ninth embodiment has the same structure in the pixel portion as that of the eighth embodiment except that the wave guide 217 is formed on an inner surface of the upper substrate 320 instead of on the inner surface of the lower insulating substrate. FIG. 15A illustrates wave guide 217 as unevenness and FIG. 15B illustrates wave guide 217 as a convex lens.

The method of forming the structure if FIG. 15A and FIG. 15B is as follows. After forming the TFT and the light emitting element on the lower insulating substrate 200, a material having optical transmissivity is deposited on the inner side of the upper substrate 320. The material having the optical transmissivity is then patterned to form the wave guide 217 on the inner of the upper substrate 320 in the encapsulation junction region. After forming the wave guide 217 on the inner side of the encapsulating junction region in the upper substrate 320, the lower electrode 280, the organic layer 300, and the upper electrode 310 are then formed on the upper substrate 320.

TENTH EMBODIMENT

Figure 16A:
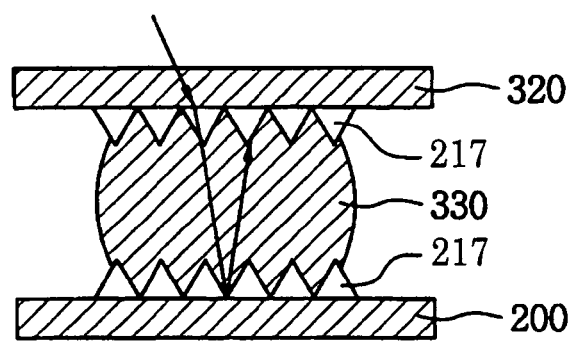
FIGS. 16A and 16B illustrate a cross section of an encapsulation junction region according to a tenth embodiment of the present invention where there are two wave guides present, one on an inner surface of the upper substrate and another on the inner surface of the lower insulating substrate.
Figure 16B:
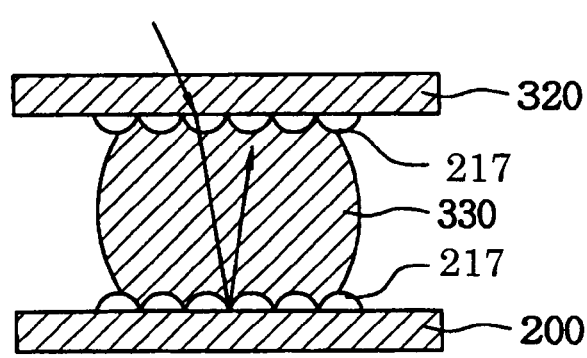

FIG. 16A and FIG. 16B are a cross-sectional view illustrating an encapsulating junction region of the organic electro luminescent display in accordance with a tenth embodiment of the invention. The organic electro luminescent display according to the tenth embodiment has the TFT and the light emitting element shown in FIG. 7 in the pixel portion, and has two wave guides 217, one formed on the inner surface of the upper substrate 320 and one formed on the inner surface of the lower insulating substrate 200. FIG. 16A illustrates wave guide 217 as unevenness while FIG. 16B illustrates wave guide 217 as a convex lens.

The wave guide 217 is formed on the inner side lower insulating substrate 200 is formed according to the same processes as that described in the eighth embodiment of FIG. 14A and FIG. 14B. The wave guide 217 formed on the inner side upper substrate 320 is made according to a process described in the formation of the wave guide 217 in the discussion of FIGS. 15A and 15B (the ninth embodiment). That is, the lower electrode 280, the organic layer 300, and the upper electrode 310 are then formed on an inner surface of upper substrate 320 after waveguide 217 is formed in the inner surface of upper substrate 320.

In addition, in the above-mentioned embodiments of the invention, an organic electro luminescent display having enhanced curing efficiency is disclosed by using both a reflecting plate and a wave guide formed in the upper substrate 320 or the lower insulating substrate 200 either respectively or anti respectively. Alternatively, two reflecting plates may be used, one attached to a surface of the upper substrate 320 and one attached to a surface of lower insulating substrate 200. The reflecting plates formed on both sides of the organic electro luminescent display are preferably formed to have a mirror attached to.

According to the invention, auxiliary layers are formed to remove organic layers on the encapsulating junction region, so that the invention can provide an organic electro luminescent display capable of easily removing the organic layers formed on the encapsulating junction region during the process of forming organic layers. In addition, the invention can provide a method for fabricating the organic electro luminescent display with reduced damage in the pixel portion by removing the organic layers disposed on auxiliary layers by a laser instead of removing the organic layers directly formed on the substrate.

Furthermore, according to the invention, a reflecting plate is disposed in the encapsulating junction region, so that the light emitted from the light source is reflected by the reflecting plate for curing the sealant, thereby enhancing the curing state of the sealant and putting the encapsulation of the substrates in better condition. In addition, with the reflective plate, the curing time is reduced, resulting in less damage sustained in the pixel regions of the display.

While the invention has been described with reference to a particular embodiment, it is understood that the disclosure has been made for purpose of illustrating the invention by way of examples and is not limited to limit the scope of the invention. And one skilled in the art can make amend and change the invention without departing from the scope and spirit of the invention.

What is claimed is:

1. An organic electro luminescent display, comprising:
   a lower insulating substrate;
   a plurality of thin film transistors (TFTs) and a plurality of light emitting elements arranged on the lower insulating substrate;
   an upper substrate bound to the lower insulating substrate;
   a sealant arranged within an encapsulating junction region surrounding and outside of the TFTs and the light emitting elements, the sealant and the encapsulating junction region to attach the upper substrate to the lower insulating substrate, the sealant being comprised of a material that is curable upon exposure to ultraviolet radiation; and
   an auxiliary layer arranged on an inner side of one of the upper substrate and the lower insulating substrate and within the encapsulating junction region of the display, the auxiliary layer being comprised of a material selected from a group consisting of indium tin oxide, indium zinc oxide, indium cesium oxide.

2. The display of claim 1, wherein the auxiliary layer is arranged on the lower insulating substrate.

3. The organic electro luminescent display of claim 1, the auxiliary layer aids in removal by laser of organic layers arranged on the auxiliary layer.

4. The organic electro luminescent display of claim 1, further comprising a first electrode arranged on the lower insulating substrate at a location corresponding to the light emitting elements, the auxiliary layer being comprised of a same material as that of the first electrode.

5. The organic electro luminescent display of claim 1, the auxiliary layer being in direct contact with the sealant.

6. The organic electro luminescent display of claim 4, the auxiliary layer being in direct contact with the sealant.

7. An organic electro luminescent display, comprising:
   a lower insulating substrate;

a plurality of thin film transistors (TFTs) and a plurality of light emitting elements arranged on the lower insulating substrate, each of the light emitting elements include an organic layer arrangement;

an upper substrate bound to the lower insulating substrate;

an encapsulating junction region surrounding and outside of the TFTs and light emitting elements, the encapsulating junction region to attach the upper substrate to the lower insulating substrate via a sealant; and an auxiliary layer arranged within the encapsulating junction region and arranged between the lower insulating substrate and the upper substrate, the auxiliary layer being comprised of a material selected from a group consisting of acrylic photoresist and polyimide.

8. The organic electro luminescent display of claim 7, the sealant being a UV curable resin.

9. The organic electro luminescent display of claim 7, the auxiliary layer being arranged on one of the lower insulating substrate and the upper substrate.

10. The organic electro luminescent display of claim 7, wherein the auxiliary layer is adapted to aid in a removal of portions of the organic layer arrangement arranged on the auxiliary layer.

11. The organic electro luminescent display of claim 7, the auxiliary layer being comprised of a material having an absorption rate that is higher than an absorption rate of the organic layer arrangement at a wavelength used to remove the organic layer arrangement from the auxiliary layer.

12. The organic electro luminescent display of claim 7, the auxiliary layer being comprised of materials that require a higher laser energy density to remove than the organic layer arrangement.

13. The organic electro luminescent display of claim 7, the organic layer arrangement comprises an emission layer (EML).

14. The organic electro luminescent display of claim 7, the organic layer arrangement comprises:
 a hole injection layer (HIL);
 a hole transporting layer (HTL);
 an emission layer(EML);
 an electron transporting layer (ETL); and
 an electron injection layer (EIL).

15. The organic electro luminescent display of claim 7, further comprising:

a first electrode arranged on the lower insulating substrate; and a pixel defining layer arranged on the first electrode, the auxiliary layer being comprised of a same material as the pixel defining layer.

16. The organic electro luminescent display of claim 15, the auxiliary layer being produced at a same time as the pixel defining layer.

17. An organic electro luminescent display comprising an image producing pixel region and an encapsulation junction region surrounding the pixel region and external to the pixel region, the organic electro luminescent display comprising:

a lower insulating substrate;

a first electrode arranged on the lower insulating substrate;

a pixel defining layer arranged to cover only a fraction of an upper surface of the first electrode;

an organic layer arrangement arranged over exposed portions of the upper surface of the first electrode and over the pixel defining layer, the organic layer arrangement including an organic emission layer;

a second electrode arranged on the organic layer arrangement;

an upper substrate arranged to encapsulate the first electrode, the organic layer arrangement, and the second electrode; and an auxiliary layer arranged on one of the lower insulating substrate and the upper substrate and between the lower insulating substrate and the upper substrate, the auxiliary layer being arranged within the encapsulation junction region, the auxiliary layer being comprised of a same material as the pixel defining layer.

18. The organic electro luminescent display of claim 17, the auxiliary layer to reduce a number of laser pulses and reduce a laser energy needed in a laser ablation process to remove portions of the organic layer arrangement arranged on the auxiliary layer.

19. The organic electro luminescent display of claim 17, the auxiliary layer being comprised of a material selected from a group consisting of acrylic photoresist and polyimide.

20. The organic electro luminescent display of claim 17, the auxiliary layer being produced at a same time and on a same layer as the pixel defining layer.

* * * * *